(12) United States Patent
Zhang et al.

(10) Patent No.: US 12,426,400 B2
(45) Date of Patent: Sep. 23, 2025

(54) FLEXIBLE PHOTOVOLTAIC ASSEMBLY AND MANUFACTURING METHOD THEREFOR

(71) Applicants: WUXI COOP&INNO GREEN ENERGY TECHNOLOGY CO., LTD., Wuxi (CN); SUZHOU COOP&INNO GREEN ENERGY TECHNOLOGY CO., LTD., Suzhou (CN); WUXI DINGSENMAO TECHNOLOGY CO., LTD., Wuxi (CN)

(72) Inventors: Yujun Zhang, Suzhou (CN); Aibing Tao, Suzhou (CN); Huanhuan Zhang, Suzhou (CN); Jia Shen, Suzhou (CN); Guoming Zhang, Suzhou (CN)

(73) Assignees: WUXI COOP&INNO GREEN ENERGY TECHNOLOGY CO., LTD., Jiangsu (CN); SUZHOU COOP&INNO GREEN ENERGY TECHNOLOGY CO., LTD., Suzhou (CN); WUXI DINGSENMAO TECHNOLOGY CO., LTD., Jiangsu (CN)

( * ) Notice: Subject to any disclaimer, the term of this patent is extended or adjusted under 35 U.S.C. 154(b) by 886 days.

(21) Appl. No.: 17/433,648

(22) PCT Filed: Feb. 17, 2020

(86) PCT No.: PCT/CN2020/075534
§ 371 (c)(1),
(2) Date: Aug. 25, 2021

(87) PCT Pub. No.: WO2020/173321
PCT Pub. Date: Sep. 3, 2020

(65) Prior Publication Data
US 2022/0149226 A1    May 12, 2022

(30) Foreign Application Priority Data

Feb. 28, 2019    (CN) ......................... 201910148605.8

(51) Int. Cl.
*H10F 71/00*    (2025.01)
*H10F 19/85*    (2025.01)
*H10F 19/90*    (2025.01)

(52) U.S. Cl.
CPC ........... *H10F 71/137* (2025.01); *H10F 19/85* (2025.01); *H10F 19/904* (2025.01)

(58) Field of Classification Search
CPC ............... H01L 31/1876; H01L 31/049; H01L 31/0508; H01L 31/042; H01L 31/048; H01L 31/05; H02S 30/20; Y02E 10/50
See application file for complete search history.

(56) References Cited

U.S. PATENT DOCUMENTS 5,478,402 A * 12/1995 Hanoka ............... H01L 31/0481
156/99
2009/0260675 A1    10/2009 Erdemli et al.
(Continued)

FOREIGN PATENT DOCUMENTS

| CN | 102244121 A * | 11/2011 |
| CN | 102593254 A | 7/2012 |

(Continued)

OTHER PUBLICATIONS

International Search Report and Written Opinion issued in corresponding International Application No. PCT/CN2020/075534; mailed Apr. 13, 2020; State Intellectual Property Office of the P.R. China, Beijing, China, 14 pgs.

(Continued)

*Primary Examiner* — Michael Y Sun
(74) *Attorney, Agent, or Firm* — HAUPTMAN HAM, LLP

(57) ABSTRACT

Provided in the present application is a manufacturing method for a flexible photovoltaic assembly comprising: 1)

(Continued)

connecting cells in series to form a cell string; 2) connecting the cell strings in series and/or in parallel to form a cell layer, wherein a gap is present between adjacent cell strings; 3) sequentially stacking a front panel material layer, a front packaging material layer, the cell layer, a back packaging material layer, and a back panel material layer, and performing lamination to obtain a laminated member; 4) performing punching on the laminated member to remove the material layers that are located in the gap to obtain a photovoltaic assembly, the photovoltaic assembly comprising photovoltaic assembly units, and the photovoltaic assembly units are electrically connected by the electrical connection material; and 5) sequentially stacking a composite material layer, the photovoltaic assembly, a flexible substrate layer, performing lamination to obtain a flexible photovoltaic assembly.

12 Claims, 4 Drawing Sheets

(56) References Cited

U.S. PATENT DOCUMENTS

| | | | |
|---|---|---|---|
| 2010/0031996 A1 | 2/2010 | Basol | |
| 2010/0154857 A1* | 6/2010 | Tell | H02S 40/36 |
| | | | 136/244 |
| 2013/0019926 A1* | 1/2013 | Yanase | H01L 31/02013 |
| | | | 257/E31.117 |
| 2013/0032195 A1* | 2/2013 | Peng | H01L 31/049 |
| | | | 136/246 |
| 2013/0213456 A1* | 8/2013 | Schlemper | H01L 31/0445 |
| | | | 438/66 |
| 2014/0060609 A1* | 3/2014 | Kumar | H01L 31/0512 |
| | | | 438/66 |
| 2015/0013768 A1* | 1/2015 | Odoi | C08F 210/02 |
| | | | 136/259 |
| 2015/0263196 A1* | 9/2015 | Meisel | H01L 31/022441 |
| | | | 438/66 |
| 2019/0131475 A1* | 5/2019 | Sun | H01L 31/022441 |

FOREIGN PATENT DOCUMENTS

| | | |
|---|---|---|
| CN | 107393995 A | 11/2017 |
| CN | 107507849 A | 12/2017 |
| CN | 206962748 U | 2/2018 |
| CN | 206976368 U | 2/2018 |
| CN | 108878577 A | 11/2018 |
| CN | 208478354 U | 2/2019 |
| CN | 109920878 A | 6/2019 |
| JP | H0799336 A | 4/1995 |
| JP | 2003273374 A | 9/2003 |
| JP | 2010245176 A | 10/2010 |
| JP | 2011035200 A | 2/2011 |
| JP | 2013530533 A | 7/2013 |
| JP | 2018113440 A | 7/2018 |
| WO | 2018150905 A1 | 8/2018 |

OTHER PUBLICATIONS

First Office Action issued in corresponding Chinese Application No. 201910148605.8; mailed Aug. 17, 2020; State Intellectual Property Office of the P.R. China, Beijing, China, 17 pgs.

\* cited by examiner

FLEXIBLE PHOTOVOLTAIC ASSEMBLY AND MANUFACTURING METHOD THEREFOR

RELATED APPLICATIONS

The present application is a U.S. National Phase of International Application Number PCT/CN2020/075534, filed Feb. 17, 2020, and claims the priority of Chinese Application No. 2019101486058, filed Feb. 28, 2019.

TECHNICAL FIELD OF THE INVENTION

This application relates to the field of photovoltaic technology, in particular to a manufacturing method for flexible photovoltaic assemblies and a flexible photovoltaic assembly prepared by the method.

BACKGROUND OF THE INVENTION

With the rise of energy prices, the development and utilization of new energy has become the main topic of research in the energy field today. Since solar energy has the advantages of non-polluting, no regional restrictions, and inexhaustible, the research on solar power generation has become the main direction for the development and utilization of new energy. The use of solar energy to generate electricity is one of the main ways people use solar energy today.

The front panel of the existing solar photovoltaic assembly products is made of glass, which is heavy and fragile and inconvenient to transport, and it is suitable for large-scale ground power stations or rooftop power stations, and is not suitable for civil photovoltaic products that are frequently transported. At present, the rapid growth of new energy battery application equipment, including various electric vehicles, various battery energy storage packages, can meet certain needs of people's outdoor mobile life, but in the occasions where city power supply cannot be provided, these products will face difficulties after power consumption, and there is no supplementary backup plan. In fact, the current industrialized crystalline silicon photovoltaic products are too bulky, and thin-film assemblies of amorphous silicon are light enough to meet the requirement of high power but are too expensive. There are also flexible photovoltaic applications on the market that can meet low-power requirements, but the actual power is relatively small with low efficiency, and it is more difficult to expand high-power applications, which is not suitable for the needs of high-power outdoor supplementary power generation.

Flexible photovoltaic assemblies are connected by a plurality of solar photovoltaic panels, the encapsulation of a single small photovoltaic panel to the connection of many small photovoltaic panels involves multiple challenges such as circuit connection performance and safety, outdoor weather resistance, reliability, and weight changes. Flexible photovoltaic assemblies need to be improved in terms of high-power expansion and application and outdoor weather resistance. For example, in the invention patent with the application number CN201711040972 and titled "a manufacturing method for flexible photovoltaic assemblies", the technical solution in this patent still has the disadvantages of more production processes of flexible photovoltaic assemblies, difficult to form large-scale production, and high production and processing costs, which needs to be further improved and designed to adapt to changes in automation and high-efficiency production.

Therefore, there are at least the following problems in the prior art: there are many manufacturing process flows of flexible photovoltaic assemblies, and it is difficult to form large-scale production, resulting in high manufacturing and processing costs, and restricting its popularization and application.

SUMMARY OF THE INVENTION

In view of this, in order to overcome the shortcomings of the prior art, the purpose of this application is to provide an improved manufacturing method for flexible photovoltaic assemblies to simplify the manufacturing process of flexible photovoltaic assemblies, enable mass production of flexible photovoltaic assemblies, and reduce manufacturing and processing costs.

The present disclosure provides a manufacturing method for flexible photovoltaic assemblies, which is implemented as follows:

A manufacturing method for flexible photovoltaic assemblies, comprises the following steps:
1) connecting a plurality of cells in series to form a cell string;
2) using electrical connection materials to connect a plurality of the cell strings in series and/or in parallel to form a cell layer, wherein there are gaps between adjacent cell strings;
3) sequentially stacking a front panel material layer, a front packaging material layer, the cell layer, a back packaging material layer, and a back panel material layer, and performing lamination to obtain a laminated member; wherein the front panel material layer, the front packaging material layer, the back packaging material layer and the back panel material layer are respectively formed of a front panel material, a front packaging material, a back packaging material and a back panel material; the front panel material and the back panel material may be the same or different, and the front packaging material and the back packaging material may be the same or different;
4) performing punching on the laminated member to remove the front panel material, the front packaging material, the back packaging material, and the back panel material that are located in the gaps to obtain a photovoltaic assembly, the photovoltaic assembly comprising a plurality of photovoltaic assembly units, and the plurality of photovoltaic assembly units are electrically connected by means of the electrical connection materials;
5) sequentially stacking a composite material layer, the photovoltaic assembly, and a flexible substrate layer, and performing lamination to obtain a flexible photovoltaic assembly, that is, the prepared flexible photovoltaic assembly is a whole, which can be folded and bent.

In some embodiments, each cell string comprises two or more cells connected in series, and the cell layer comprises two or more cell strings connected in series or in parallel. In other embodiments of the present disclosure, the composite material layer may also cover the front surface and back surface of the flexible photovoltaic assembly unit at the same time.

According to some preferred implementation aspects of the present disclosure, in step 2), a plurality of cell strings is connected in parallel, and then a plurality of the cell strings that are connected in parallel is connected in series to form the cell layer; or, a plurality of cell strings is connected in series, and then a plurality of the cell strings that are connected in series is connected in parallel to form the cell layer. The cell layer is composed of a plurality of electrically connected cell strings, the cell strings can be connected in parallel or in series, and the cells inside the cell strings are connected in series.

Preferably, in step 2), the electrical connection materials are wires, and the plurality of cell strings is connected in series and/or in parallel by using the wires. The provision of wire connection can bend adjacent photovoltaic assembly units to achieve a flexible effect. The wires are conductive materials that can be bent repeatedly, including flexible wires or flexible cables.

According to some preferred implementation aspects of the present disclosure, each wire comprises a conductive part for electrically connecting with the cell strings and an insulating part sleeved on the outside of the conductive part, and the insulating part is located in the gaps between adjacent cell strings. The material of the conductive part is a metal that can conduct electricity, such as copper, and the material of the insulating part is a polymer that can play an insulating role, such as PVC or cloth.

In some embodiments, in step 1), the cells in each cell string are connected in series by solder strips or conductive tapes; each cell has a plurality of solder strips or conductive tapes arranged in parallel with each other, and the solder strips or conductive tapes on the cell located at an end of the cell string are connected by means of the conductive part of a wire. That is, when the cell located at an end of the cell string has a plurality of solder strips or conductive tapes arranged parallel to each other, the solder strips or conductive tapes on the same cell are connected in parallel through the conductive part at one end of a wire, and the solder strips or conductive tapes on the adjacent cell strings are also connected in series or in parallel through the conductive part of the wire.

According to some preferred implementation aspects of the present disclosure, in step 3), the front panel material layer and/or the back panel material layer is provided with wire lead-out holes, and the wire lead-out holes are opened in the front panel material layer and the back panel material layer at positions corresponding to the insulating parts. The purpose of opening the lead-out holes is to cause the insulation parts of the wires to be located in the lead-out holes during stacking and lamination, which not only facilitates the positioning of the front panel material layer and/or the back panel material layer and the cell layer, but also facilitates the subsequent punching operation, and prevents the wires from being punched out during the punching operation, causing product defects or damage.

In some embodiments, during stacking in step 5), there is also a composite material layer between the photovoltaic assembly and the flexible substrate layer, that is, the photovoltaic assembly has a composite material layer on both sides, and the composite material layer on the back surface of the photovoltaic assembly has a flexible substrate layer attached to the side away from the photovoltaic assembly.

According to some preferred implementation aspects of the present disclosure, the material of the front panel material layer is PC, PET, ETFE, FEP or PMMA; the material of the back panel material layer is PC, PET, ETFE, FEP, PMMA or carbon fiber. PC, PET, ETFE, FEP or PMMA are common materials in the field of polymer materials, the raw materials are easy to obtain, have good transparency, have little blocking effect on light, and can not only protect the cells, but also have a certain degree of toughness and bending capability, especially suitable for flexible photovoltaic assembly products.

According to some preferred implementation aspects of the present disclosure, the manufacturing method further comprises: 6) punching the flexible photovoltaic assembly again after the lamination in step 5) to remove all materials in the gaps except the wires. That is to say, the composite material layer and the flexible substrate layer covering the photovoltaic assembly in step 5) are punched out corresponding to the gap between adjacent cell strings, so that the flexible photovoltaic assembly has greater freedom of movement between the units, is easier to fold and bend, and will not be bound by the composite material layer and the flexible substrate layer. Moreover, no matter how many times the punching is performed, the cell strings are still electrically connected.

In some embodiments, the method further comprises: 7) laminating and combining the flexible photovoltaic assembly again after the punching process in step 6): covering a composite material layer on the front and back surfaces of the flexible photovoltaic assembly; or, covering a composite material layer on the front surface of the flexible photovoltaic assembly, and covering a flexible substrate layer on the back surface of the flexible photovoltaic assembly; or, providing a wear-resistant material on the side of the composite material layer and/or the flexible substrate layer away from the flexible photovoltaic assembly. Through laminating and combining again, protection has been formed on the front and back surfaces of the flexible photovoltaic assembly, and the service life of the product is prolonged.

Preferably, the method further comprises: 7) laminating and combining the flexible photovoltaic assembly again after the punching process in step 6): covering a composite material layer on the front surface of the flexible photovoltaic assembly, covering a flexible substrate layer on the back surface of the flexible photovoltaic assembly, and providing a wear-resistant material on the side of the flexible substrate layer away from the flexible photovoltaic assembly.

When punching and laminating again, the front surface of the laminated material must be a transparent composite material, the back surface can be selected from transparent materials or different color composite materials based on needs, and the semi-finished flexible photovoltaic assembly after the first lamination and the first punching process is placed therebetween. Wherein, the composite material is a flexible material, which can be bent at will, and also has the characteristics of weather resistance, insulation, flame retardancy, and water resistance.

The use of the above-mentioned secondary packaging process can not only realize the flexibility of the photovoltaic assembly, but also realize the circuit protection of comprehensive water-blocking for the assembly, which can effectively meet the performance requirements of lightness and weather resistance required by various application scenarios, and prolong the service life of the assembly.

Specifically, the wear-resistant material is arranged on the surface of the flexible photovoltaic assembly in strips, and its length extension direction is perpendicular to the width direction or the length direction of the flexible photovoltaic assembly.

According to some preferred implementation aspects of the present disclosure, the material of the composite material layer is a thermoplastic polymer, such as a thermoplastic rubber material or a thermoplastic plastic material.

Preferably, the material of the composite material layer is TPU, TPE or TPV.

According to some preferred implementation aspects of the present disclosure, the distance between adjacent cells in the cell string is −1.5 mm to 2 mm; the distance between adjacent cell strings is 2 mm to 50 mm. When the distance between adjacent cells in the cell string is less than 0, that is, there is a partial overlap between adjacent cells, forming a form like shingled photovoltaic assemblies, and the distance between the cell strings determines the subsequent winding degree of the flexible photovoltaic assembly.

Preferably, the distance between adjacent cells in the cell string is −1.5 mm; the distance between adjacent cell strings is 20 mm.

According to some preferred implementation aspects of the present disclosure, the cells are one or more of crystalline silicon cells, split cells that are split from crystalline silicon cells, back contact cells, laminated cells, and amorphous silicon cells.

Preferably, the cells are 5-inch crystalline silicon cells, 6-inch crystalline silicon cells, or cells which are split from a 5-inch crystalline silicon cell or a 6-inch crystalline silicon cell according to multiple equal parts, the multiple equal parts are 2 to 24 equal parts. That is, the flexible photovoltaic assembly of the present disclosure is suitable for cells of various types and sizes, and the smaller the size of the cells, the flexibility of the finally prepared assembly is relatively better.

The present disclosure also provides a flexible photovoltaic assembly manufactured by adopting the manufacturing method described above.

Compared with the prior art, the beneficial effects of the present disclosure are: in the manufacturing method for flexible photovoltaic assemblies of the present disclosure, by connecting adjacent cell strings through the wire, and subsequently performing lamination and punching, the implementation by automated equipment can be realized, and then the large-scale and mass-manufacturing of flexible photovoltaic assemblies can be realized, and the production efficiency can be improved. The manufacturing cost of flexible photovoltaic assemblies can be effectively reduced, and the cost performance of flexible photovoltaic assemblies is better than that of existing photovoltaic assemblies or thin-film flexible assemblies.

BRIEF DESCRIPTION OF THE DRAWINGS

For more clearly explaining the technical solutions in the embodiments of the present disclosure, the accompanying drawings used to describe the embodiments are simply introduced in the following. Apparently, the below described drawings merely show a part of the embodiments of the present disclosure, and those skilled in the art can obtain other drawings according to the accompanying drawings without creative work.

In the figures, cell string—1, solder strip or conductive tape—11, wire—12, conductive part—121, insulating part—122, packaging material—2, front panel material layer or back panel material layer—3, wire lead-out hole—4, photovoltaic assembly unit—5, cell—101, composite material layer—102, flexible substrate layer—103, wear-resistant material strip—104.

DETAILED DESCRIPTION OF EXEMPLARY EMBODIMENTS

A flexible photovoltaic assembly and a manufacturing method therefor are provided in embodiments of the present disclosure.

In order to enable those skilled in the art to better understand the solutions of the present application, the technical solutions in the embodiments of the present application are explained clearly and completely below in conjunction with the accompanying drawings, and apparently, the described embodiments are merely a part of the embodiments of the present application, not all the embodiments. Based on the embodiments of the present application, all other embodiments obtained by one of ordinary skill in the art without creative work fall within the protective scope of the present application.

Figure 1:
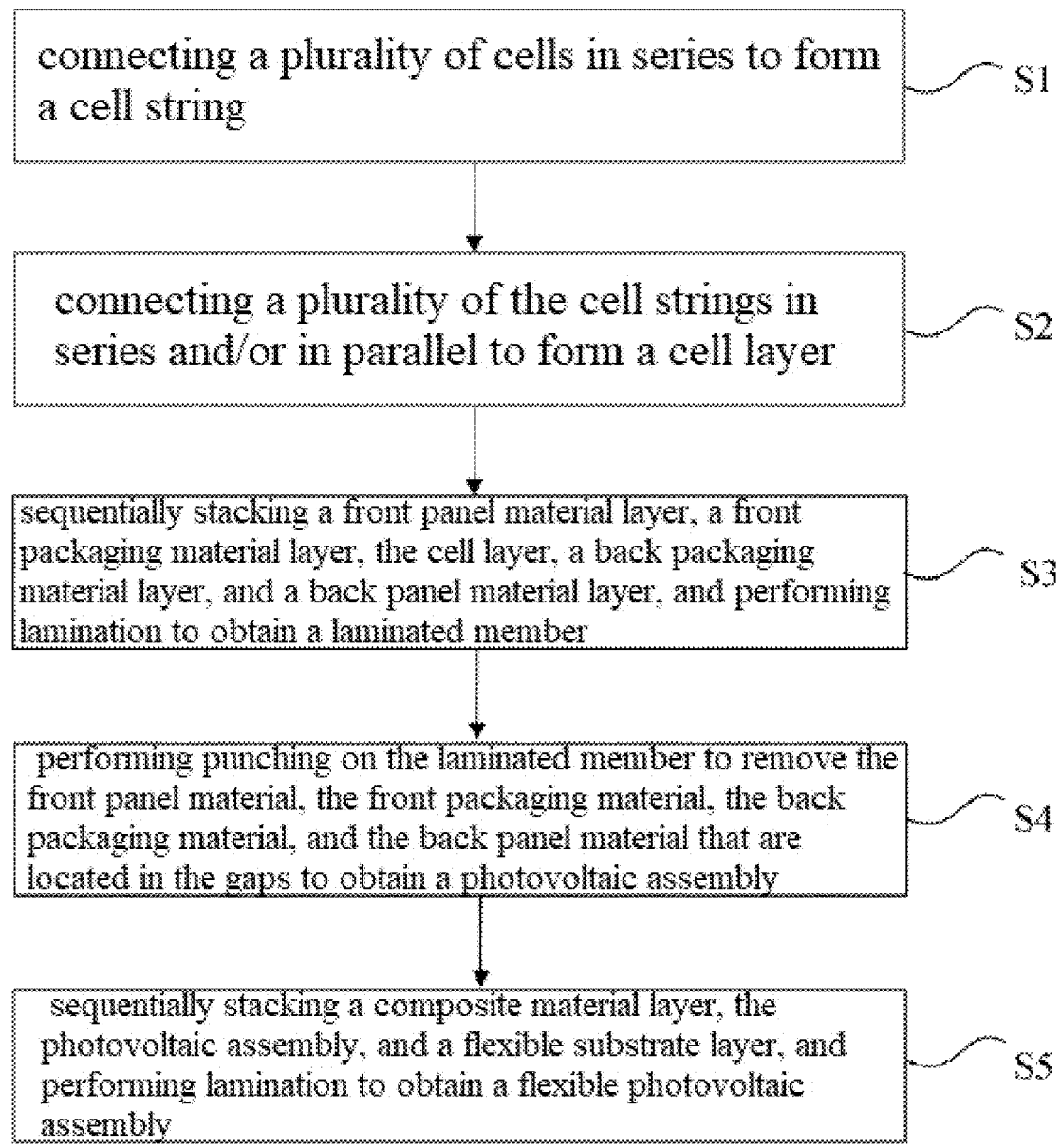
FIG. 1 is a schematic flow chart of a manufacturing method for flexible photovoltaic assemblies in a preferred embodiment of the present disclosure.

FIG. 1 is a schematic flow chart of an embodiment of a manufacturing method for flexible photovoltaic assemblies in the present disclosure. Although this application provides methods and operation steps or device structures as shown in embodiments or drawings described below, the methods or devices may comprise more or less operation steps or assembly units based on convention or without creative labor. In steps or structures where there is no necessary causal relationship logically, the execution order of these steps or the assembly structure of the device is not limited to the execution order or assembly structure shown in the embodiments or the drawings of the present application.

Specifically, as shown in FIG. 1, a manufacturing method for flexible photovoltaic assemblies of this embodiment comprises the following steps:

S1: connecting a plurality of cells 101 in series to form a cell string 1;

Wherein, the cells 101 used comprise crystalline silicon cells, split cells that are split from crystalline silicon cells, back contact cells, laminated cells, amorphous silicon cells, and the like. When welding the cell string 1 in series, the distance between the cells 101 is controlled to −1.5 mm, and when welding the next cell string after the cell string 1 is welded, the gap between adjacent cell strings (cells) is broadened to 20 mm, and only the device parameters need to be adjusted.

Figure 2:
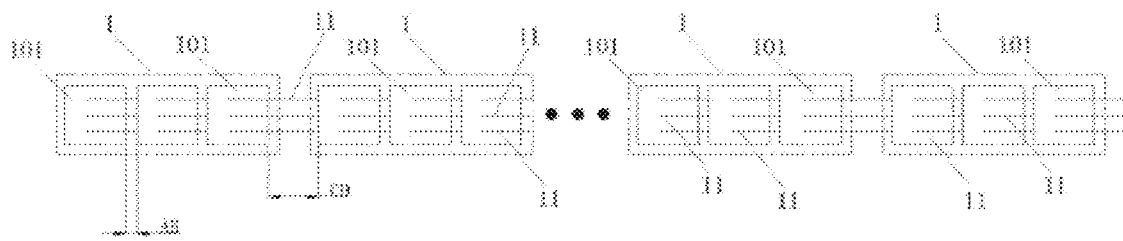
FIG. 2 is a schematic diagram of a structure in which cell strings are connected in series in a preferred embodiment of the present disclosure.

FIG. 2 is a schematic diagram of a structure in which the cell strings 1 are connected in series obtained in this embodiment. As shown in FIG. 2, each cell string 1 is composed of three cells 101 connected in series, the cells 101 are connected by a solder strip or conductive tape 11, and the distance AB between the cells 101 inside the cell string 1 is −1.5 mm to 2 mm. The distance CD between adjacent cell strings 1 is 2 mm to 50 mm, and the −1.5 mm means that the adjacent cells 101 in the cell string 1 overlap by a width of 1.5 mm, that is, form a form like shingled photovoltaic assemblies.

The cells used may be 5-inch crystalline silicon cells or 6-inch crystalline silicon cells that are sold on the market, and may also include cells which are split from a 5-inch crystalline silicon cell or a 6-inch crystalline silicon cell according to multiple equal parts, the multiple equal parts are 2 to 24 equal parts. That is, the manufacturing method for flexible photovoltaic assemblies in this embodiment is suitable for cells of various types and sizes, and the smaller the size of the cells, the flexibility of the finally obtained flexible photovoltaic assembly is relatively better.

S2: connecting a plurality of the cell strings 1 in series and/or in parallel to form a cell layer.

Figure 3:
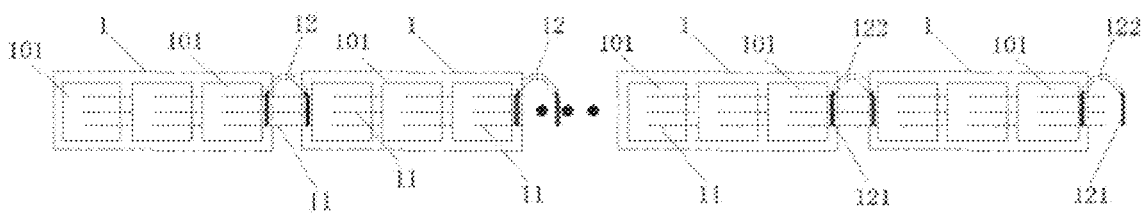
FIG. 3 is a schematic diagram of a structure in which adjacent cell strings are connected in series with a wire in a preferred embodiment of the present disclosure.

FIG. 3 is a schematic diagram of a structure in which a single row of cell strings 1 are connected in series by using the wire 12 in this embodiment. As shown in FIG. 3, in this example, it is possible to choose to connect the cells 101 in a plurality of cell strings 1 in series, and then a plurality of structures as shown in FIG. 3 are connected in parallel to form the cell layer. Parallel connection of the cell strings 1 is achieved by connecting the solder strips or conductive tapes 11 on the same cell 101 by means of the wires 12, and both ends of one wire 12 are respectively electrically connected to the solder strips or conductive tapes 11 of adjacent cell strings 1.

Each wire 12 comprises a conductive part 121 for electrically connecting with the cell strings 1 and an insulating part 122 sleeved on the outside of the conductive part 121, and the insulating part 122 is located in the gap between adjacent cell strings 1. The material of the conductive part 121 is a metal that can conduct electricity, such as copper, and the material of the insulating part 122 is a polymer that can play the role of insulation, such as PVC or cloth. That is, the conductive part 121 is used to electrically connect with the solder strips or the conductive tapes 11 on the cells 101, and the insulating part 122 is sleeved on the outside of the conductive part 121 for insulation, and is used to cause the wire 12 exposed to the outside without danger.

Figure 4:
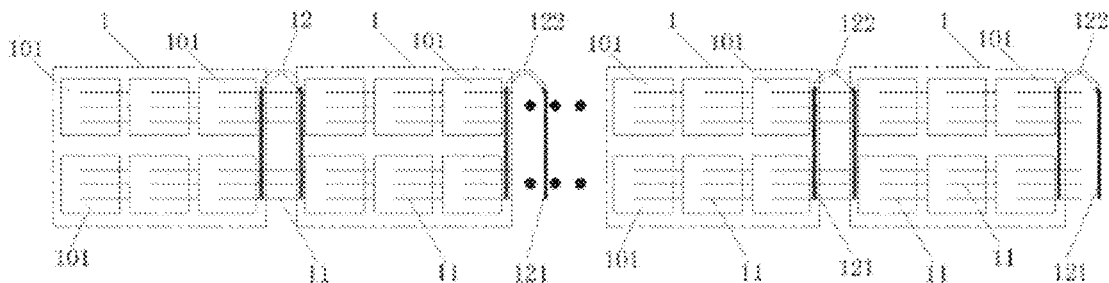
FIG. 4 is a schematic diagram of a structure in which two cell strings are connected in parallel and then connected in series with two adjacent cell strings in another preferred embodiment of the present disclosure.

FIG. 4 is a schematic diagram of a structure in which two cell strings 1 are connected in parallel obtained in another embodiment. As shown in FIG. 4, in this example, two or more cell strings 1 are selected to be connected in parallel and then connected in series to form a cell layer. The solder strips 11 in the cell strings 1 for welding the cells 101 are connected in parallel through the conductive parts 121 of the wires 12, and the two adjacent cell strings 1 connected in parallel are connected in series through the wires 12, and the wires 12 are electrically connected with the solder strips or conductive tapes 11 of the cell strings 1, finally the whole is connected to form a circuit, with positive and negative circuit lead-out wires, which forms the cell layer.

S3: sequentially stacking a front panel material layer, a front packaging material layer, the cell layer, a back packaging material layer, and a back panel material layer, and performing lamination to obtain a laminated member.

Wherein, when stacking, the front panel material layer 3 is attached to the front surface of the cell layer through the front packaging material layer 2, the back panel material layer 3 is attached to the back surface of the cell layer through the back packaging material layer 2, and both the front panel material layer 3 and the back panel material layer 3 are opened with wire lead-out holes 4.

The wire lead-out holes 4 are opened in the front panel material layer 3 and the back panel material layer 3 at positions corresponding to the insulating parts 122, that is, the wire lead-out holes 4 are correspondingly opened in the gaps between the cell strings 1. The purpose of opening the lead-out holes 4 is to cause the insulation parts 122 of the wires 12 to be located in the lead-out holes 4 during stacking and lamination, which not only facilitates the positioning of the front panel material layer and/or the back panel material layer 3 and the cell layer, but also facilitates the subsequent punching operation, and prevents the wires 12 from being punched out during the punching operation, causing product defects or damage.

Figure 5:
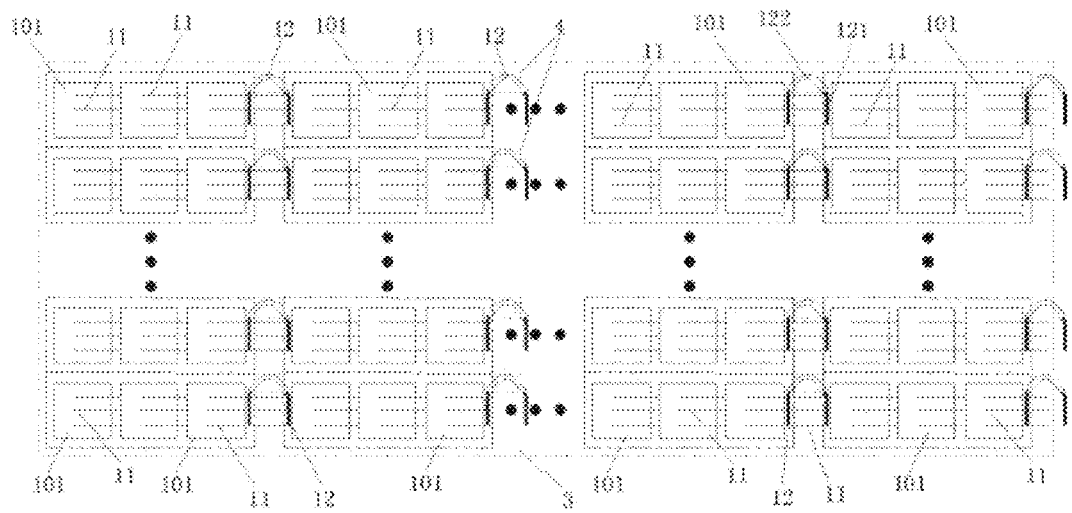
FIG. 5 is a schematic structure diagram of a laminated member in a preferred embodiment of the present disclosure.
Figure 6:
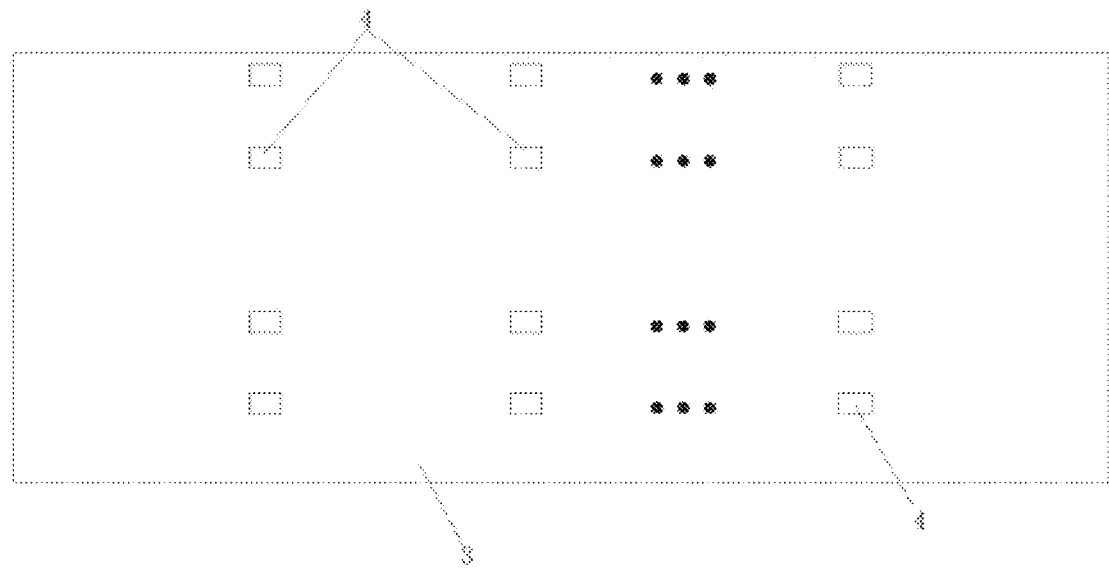
FIG. 6 is a schematic structure diagram of a front panel material layer and/or a back panel material layer in a preferred embodiment of the present disclosure.

FIG. 5 is a schematic structure diagram of the laminated member in this embodiment. FIG. 6 is a schematic structure diagram of the front panel material layer and the back panel material layer of the laminated member in this embodiment. As shown in FIG. 5, after the front panel material layer 3 and the back panel material layer 3 are laminated with the cell layer, the wires 12 for connecting the cell strings 1 in the cell layer are led out through the wire lead-out holes 4 arranged between every two adjacent cell strings 1. The wire 12 connection between any adjacent cell strings 1 is correspondingly designed with a wire lead-out hole 4. As shown in FIG. 6, the wire lead-out holes 4 are arranged in the front panel material layer 3 and the back panel material layer 3 at positions where the wires 12 are bent, that is, the position where the insulating parts 122 are located.

Figure 10:
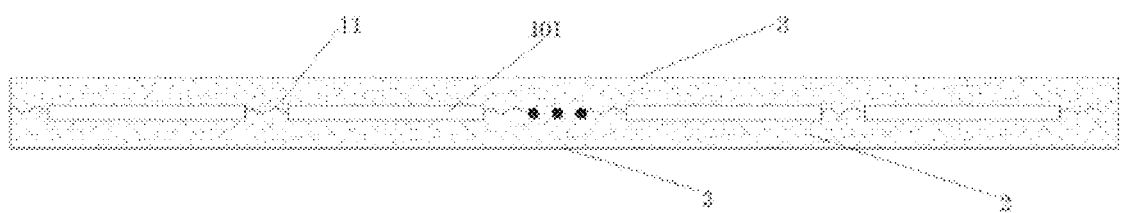
FIG. 10 is a schematic cross-sectional structure diagram of a photovoltaic assembly unit in a preferred embodiment of the present disclosure.

FIG. 10 is a schematic cross-sectional structure diagram of the photovoltaic assembly unit provided in this embodiment. As shown in FIG. 10, the photovoltaic assembly unit comprises a front panel material layer, a front packaging material layer, the cell layer, a back packaging material layer, and a back panel material layer from top to bottom, wherein the front packaging material and the back packaging material are of the same material, and after lamination, the front packaging material and the back packaging material are partially fused, and there is no clear boundary between the two. The front panel material layer may be PC board, PET board, ETFE board, FEP board or PMMA board, the middle layer is the cell layer, and the back panel material layer may be PC board, PET board, ETFE board, FEP board, epoxy board, PCB board or PMMA board, or carbon fiber board, and the packaging material in the middle adopts EVA, POE, PVB, glue, and silicone material to seal and connect.

S4: performing punching on the laminated member to remove the front panel material, the front packaging material, the back packaging material, and the back panel material that are located in the gaps to obtain a photovoltaic assembly, the photovoltaic assembly comprising a plurality of photovoltaic assembly units, and the plurality of photovoltaic assembly units are electrically connected by means of the electrical connection materials, namely the wires 12.

Figure 7:
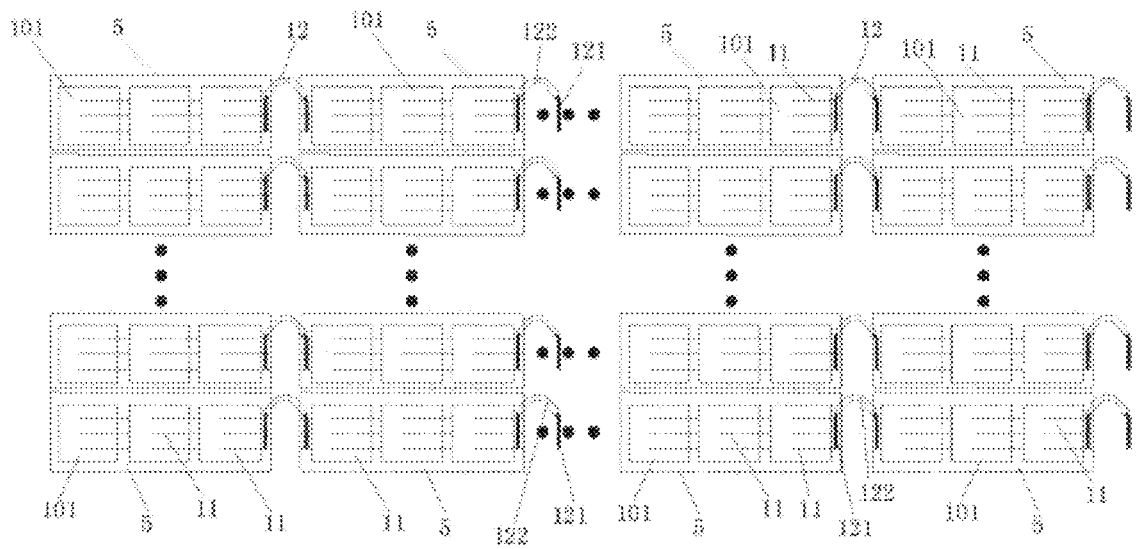
FIG. 7 is a schematic diagram of the connection structure between photovoltaic assembly units after punching process in a preferred embodiment of the present disclosure.

FIG. 7 is a schematic diagram of the connection structure of a plurality of photovoltaic assembly units that are electrically connected in this embodiment. As shown in FIG. 7, in this embodiment, the front panel material, the front packaging material, the back packaging material, the back panel material, and the redundant electrical connection materials such as the solder strips or conductive tapes 11 between the cells 101 are punched out, only the wires 12 connecting the respective cell strings 1 are retained, the electrical properties between the cell strings are still connected through the wires 12 to obtain a plurality of photovoltaic assembly units electrically connected through the wires 12.

S5: combining the plurality of photovoltaic assembly units into a whole.

Sequentially stacking a composite material layer, the photovoltaic assembly prepared in step S4, and a flexible substrate layer, and performing lamination to obtain a flexible photovoltaic assembly that can be folded and bent. The individual composite material is flexible and can be bent at wills.

In this example, the composite material layer is made of thermoplastic rubber or thermoplastic plastic material, and can be made of TPU, TPE, TPV and other materials.

Figure 8:
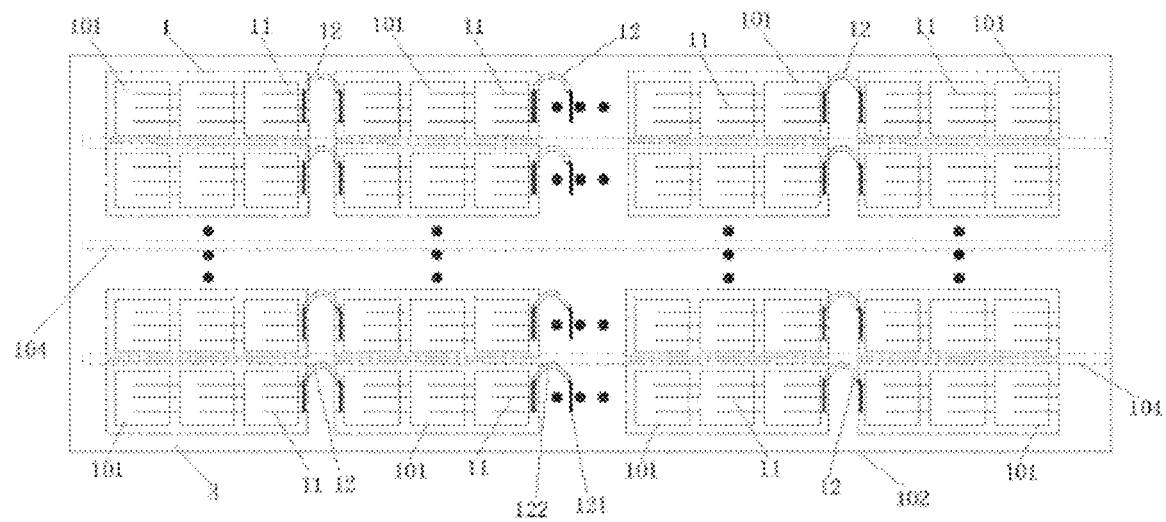
FIG. 8 is a schematic structure diagram of a flexible photovoltaic assembly in a preferred embodiment of the present disclosure.

FIG. 8 is a schematic structure diagram of the flexible photovoltaic assembly provided in this embodiment. The composite material layer 102 is stacked on the front surface of the photovoltaic assembly, and the flexible substrate layer 103 is stacked on the back surface of the photovoltaic assembly, and then lamination is performed to obtain the flexible photovoltaic assembly that can be folded and bent.

Figure 9:
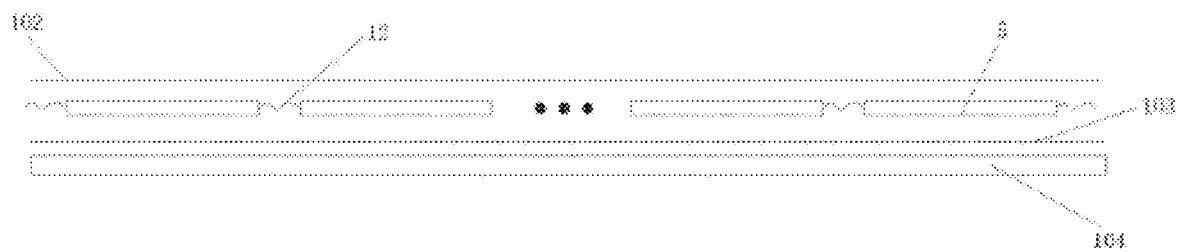
FIG. 9 is a schematic cross-sectional structure diagram of a flexible photovoltaic assembly in a preferred embodiment of the present disclosure.

FIG. 9 is a schematic cross-sectional structure diagram of the flexible photovoltaic assembly provided in this embodiment. As shown in FIG. 9, the prepared flexible photovoltaic assembly is composed of the composite material layer 102, the photovoltaic assembly units 5, and the flexible substrate layer 103 from top to bottom, and the photovoltaic assembly units 5 are electrically connected by wires 12.

In order to further increase the flexibility and service life of the flexible photovoltaic assembly, the manufacturing method in this embodiment further comprises the following steps:

S6: punching the flexible photovoltaic assembly again after the lamination to remove all materials in the gaps except the wires.

That is, after the punching process, there are at most only wires between adjacent photovoltaic assemblies to achieve electrical connection, and no other substances exist.

S7: laminating and combining the flexible photovoltaic assembly again after the punching process of step S6.

For example, the composite material layer is covered on the front and back surfaces of the flexible photovoltaic assembly; or, the composite material layer is covered on the front surface of the flexible photovoltaic assembly, and the flexible substrate layer is covered on the back surface of the flexible photovoltaic assembly; or, a wear-resistant material is provided on the side of the composite material layer and/or the flexible substrate layer away from the flexible photovoltaic assembly.

In this embodiment, it is selected in step S7 that the front surface of the flexible photovoltaic assembly that is punched in step S6 is again covered with the composite material layer 102, and the back surface is again covered with the flexible substrate layer 103, a plurality of wear-resistant material strips 104 are provided on the side of the flexible substrate layer 103 away from the photovoltaic assembly units, and the length extension direction of the wear-resistant material strips 104 is perpendicular to the width direction or the length direction of the flexible photovoltaic assembly. As shown in FIG. 8 and FIG. 9, the length extension direction of the wear-resistant material strips 104 in this embodiment is perpendicular to the width direction or the length direction of the flexible photovoltaic assembly.

Each cell string in the above embodiment comprises three cells connected in series, and in other embodiments, the number of cells in the cell strings may be two, three or more. Using the implementations of the manufacturing method for flexible photovoltaic assemblies provided by the above embodiment, the method can be implemented using automated equipment, and then the large-scale and mass-manufacturing of flexible photovoltaic assemblies can be realized, and the production efficiency can be improved. The manufacturing cost of flexible photovoltaic assemblies can be effectively reduced, and the cost performance of flexible photovoltaic assemblies is better than that of existing photovoltaic assemblies or thin-film flexible assemblies. In addition, the use of the above-mentioned secondary packaging process in this embodiment can not only realize the flexibility of the photovoltaic assembly, but also realize the circuit protection of comprehensive water-blocking for the assembly, which can effectively meet the performance requirements of lightness and weather resistance required by various application scenarios, and prolong the service life of the assembly.

Although this application provides methods and operation steps as shown in embodiments or flow charts, the means based on conventional or no creative labor may include more or less operation steps. The sequence of steps listed in the embodiments is only one of many execution orders of the steps, and does not represent the only execution order. The terms "include", "comprise" or any other variants thereof are intended to cover non-exclusive inclusion, so that a process, method, product, or device that includes a series of elements includes not only those elements, but also other elements that are not explicitly listed, or also includes elements inherent to such process, method, product, or equipment. If there are no more restrictions, it is not excluded that there are other identical or equivalent elements in the process, method, product, or device including the elements.

The various embodiments in this specification are described in a progressive manner, and the same or similar parts between the various embodiments can be referred to each other, and each embodiment focuses on the differences from other embodiments.

Although this application has been depicted through the embodiments, those of ordinary skill in the art know that this application has many variations and changes without departing from the spirit of this application, and it is hoped that the appended claims include these variations and changes without departing from the spirit of this application.

The invention claimed is:

1. A manufacturing method for a flexible photovoltaic assembly, wherein, the manufacturing method comprises the following steps:
   1) connecting a plurality of cells in series to form a cell string;
   2) using electrical connection materials to connect a plurality of the cell strings in series and/or in parallel to form a cell layer, wherein there are gaps between adjacent cell strings; the electrical connection materials are wires, and the plurality of the cell strings is connected in series and/or in parallel by using the wires; each wire comprises a conductive part for electrically connecting with the cell strings and an insulating part sleeved on the outside of the conductive part, and the insulating part is located in the gaps between adjacent cell strings;

3) sequentially stacking a front panel material layer, a front packaging material layer, the cell layer, a back packaging material layer, and a back panel material layer, and performing lamination to obtain a laminated member; wherein, the front panel material layer and/or the back panel material layer is provided with wire lead-out holes, and the wire lead-out holes are opened in the front panel material layer and the back panel material layer at positions corresponding to the insulating parts;

4) performing punching on the laminated member to remove materials that are located in the gaps to obtain a photovoltaic assembly, wherein the materials that are removed include the front panel material, the front packaging material, the back packaging material, and the back panel material, the photovoltaic assembly comprising a plurality of photovoltaic assembly units, and the plurality of photovoltaic assembly units are electrically connected by the electrical connection materials;

5) sequentially stacking a composite material layer, the photovoltaic assembly, and a flexible substrate layer, and performing lamination to obtain a flexible photovoltaic assembly;

6) punching the flexible photovoltaic assembly again after the lamination in step 5) to remove all materials in the gaps except the wires.

2. The manufacturing method for a flexible photovoltaic assembly according to claim 1, wherein, in step 2), a plurality of the cell strings is connected in parallel, and then a plurality of the cell strings that are connected in parallel is connected in series to form the cell layer; or, a plurality of the cell strings is connected in series, and then a plurality of the cell strings that are connected in series is connected in parallel to form the cell layer.

3. The manufacturing method for a flexible photovoltaic assembly according to claim 1, wherein, in step 1), the cells in each cell string are connected in series by solder strips or conductive tapes; each cell has a plurality of solder strips or conductive tapes arranged in parallel with each other, and the solder strips or conductive tapes on the cell located at an end of the cell string are connected by the conductive part of a wire.

4. The manufacturing method for a flexible photovoltaic assembly according to claim 1, wherein, the material of the front panel material layer is PC, PET, ETFE, FEP or PMMA; the material of the back panel material layer is PC, PET, ETFE, FEP, PMMA or carbon fiber.

5. The manufacturing method for a flexible photovoltaic assembly according to claim 1, wherein, the method further comprises: 7) laminating and combining the flexible photovoltaic assembly again after the punching process in step 6): covering a composite material layer on the front and back surfaces of the flexible photovoltaic assembly; or, covering a composite material layer on the front surface of the flexible photovoltaic assembly, and covering a flexible substrate layer on the back surface of the flexible photovoltaic assembly; or, providing a wear-resistant material on the side of the composite material layer and/or the flexible substrate layer away from the flexible photovoltaic assembly.

6. The manufacturing method for a flexible photovoltaic assembly according to claim 1, wherein, the method further comprises: 7) laminating and combining the flexible photovoltaic assembly again after the punching process in step 6): covering a composite material layer on the front surface of the flexible photovoltaic assembly, covering a flexible substrate layer on the back surface of the flexible photovoltaic assembly, and providing a wear-resistant material on the side of the flexible substrate layer away from the flexible photovoltaic assembly.

7. The manufacturing method for a flexible photovoltaic assembly according to claim 5, wherein, the wear-resistant material is arranged on the surface of the flexible photovoltaic assembly in strips, and its length extension direction is perpendicular to the width direction or the length direction of the flexible photovoltaic assembly.

8. The manufacturing method for a flexible photovoltaic assembly according to claim 5, wherein, the material of the composite material layer is thermoplastic polymer.

9. The manufacturing method for a flexible photovoltaic assembly according to claim 8, wherein, the material of the composite material layer is TPU, TPE or TPV.

10. The manufacturing method for a flexible photovoltaic assembly according to claim 1, wherein, the distance between adjacent cells in the cell string is −1.5 mm to 2 mm; the distance between adjacent cell strings is 2 mm to 50 mm.

11. The manufacturing method for a flexible photovoltaic assembly according to claim 10, wherein, the distance between adjacent cells in the cell string is −1.5 mm; the distance between adjacent cell strings is 20 mm.

12. The manufacturing method for a flexible photovoltaic assembly according to claim 1, wherein, the cells are one or more of crystalline silicon cells, split cells that are split from crystalline silicon cells, back contact cells, laminated cells, and amorphous silicon cells.

\* \* \* \* \*